United States Patent
Shi et al.

(10) Patent No.: US 12,469,681 B2
(45) Date of Patent: Nov. 11, 2025

(54) BROADBAND SUPPLY CIRCUITRY FOR A PLASMA PROCESSING SYSTEM

(71) Applicant: Applied Materials, Inc., Santa Clara, CA (US)

(72) Inventors: Tiefeng Shi, Santa Clara, CA (US); Gang Fu, Santa Clara, CA (US); Keith A. Miller, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 230 days.

(21) Appl. No.: 18/334,063

(22) Filed: Jun. 13, 2023

(65) Prior Publication Data
US 2024/0112886 A1    Apr. 4, 2024

Related U.S. Application Data

(60) Provisional application No. 63/377,367, filed on Sep. 28, 2022.

(51) Int. Cl.
   *H01J 37/32*    (2006.01)

(52) U.S. Cl.
   CPC .... *H01J 37/32183* (2013.01); *H01J 37/3299* (2013.01); *H01J 2237/327* (2013.01); *H01J 2237/3321* (2013.01)

(58) Field of Classification Search
   None
   See application file for complete search history.

(56) References Cited

U.S. PATENT DOCUMENTS

| | | | |
|---|---|---|---|
| 10,269,540 B1 | 4/2019 | Carter et al. | |
| 12,165,849 B2 * | 12/2024 | Torii | H01J 37/32532 |
| 2012/0075033 A1 | 3/2012 | Ouyang et al. | |
| 2016/0118227 A1 | 4/2016 | Valcore, Jr. et al. | |
| 2020/0357610 A1 | 11/2020 | Bhutta | |
| 2022/0051919 A1 | 2/2022 | Augustyniak et al. | |
| 2022/0367156 A1 * | 11/2022 | Suzuki | H01J 37/32715 |
| 2022/0375719 A1 * | 11/2022 | Topping | H01L 21/6833 |
| 2023/0031768 A1 * | 2/2023 | Maw | H05H 1/4645 |
| 2023/0274914 A1 * | 8/2023 | Marakhtanov | H01J 37/32091 361/234 |
| 2023/0386790 A1 * | 11/2023 | Wei | H01J 37/32183 |
| 2024/0282553 A1 * | 8/2024 | Zhang | H03H 7/38 |

OTHER PUBLICATIONS

International Search Report/ Written Opinion issued to PCT/US2023/025135 on Oct. 4, 2023.

* cited by examiner

*Primary Examiner* — Wilson Lee
(74) *Attorney, Agent, or Firm* — Patterson + Sheridan, LLP; B. Todd Patterson

(57) ABSTRACT

Embodiments provided herein generally include apparatus, plasma processing systems and methods for dynamic impedance matching across multiple frequency bands of a power source. An example method includes amplifying a broadband signal, splitting the amplified broadband signal across a plurality of channel paths coupled to an impedance matching network, and adjusting at least one first impedance associated with the impedance matching network to achieve a second impedance within a threshold value based at least in part on feedback associated with the broadband signal. The impedance matching network includes a plurality of impedance matching circuits coupled to plasma excitation circuitry, and each of the impedance matching circuits is coupled to a different path of the plurality of channel paths and an output node.

20 Claims, 7 Drawing Sheets

BROADBAND SUPPLY CIRCUITRY FOR A PLASMA PROCESSING SYSTEM

CROSS-REFERENCE TO RELATED APPLICATIONS

This application claims priority to U.S. Patent Application Ser. No. 63/377,367, entitled "BROADBAND SUPPLY CIRCUITRY FOR A PLASMA PROCESSING SYSTEM," filed Sep. 28, 2022, and assigned to the assignee hereof, the contents of each of which are hereby incorporated by reference in their entireties.

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably forming, processing and filling high aspect ratio features are some of the key technology challenges for the next generation of semiconductor devices. High aspect ratio openings used to form the features are typically formed using a plasma-assisted process, such as a reactive ion etch (RIE) process capable of directionally controlled (i.e., anisotropic) material removal to transfer a pattern from a mask layer to exposed portions of the substrate surface there beneath. Similarly, other key plasma utilizing processes include physical vapor deposition (PVD) and plasma enhanced chemical vapor deposition (PECVD) processes that typically utilize plasma generated ions to re-sputter and/or reshape a deposited material layer due to the bombardment of the substrate surface by plasma generated ions. As feature sizes continue to shrink and pattern density continues to increase, the degree of anisotropy and processing uniformity of an RIE, PVD or PECVD processes are critical factors in forming and/or filling closely spaced (fine pitched) high aspect ratio openings.

For plasma assisted processes where the plasma ions play a major role, ion energy control is always challenging the semiconductor equipment industry. In a typical plasma-assisted process, the substrate is positioned on a substrate support, such as an electrostatic chuck (ESC) disposed in a processing chamber. In an etch process and during at least a portion of a PVD or PECVD process a plasma can be formed over the substrate to allow ions to be accelerated from the plasma towards the substrate across a plasma sheath, i.e., region depleted of electrons, formed between the plasma and the surface of the substrate. Traditionally, radio frequency (RF) substrate biasing methods, which use a single driven RF frequency sinusoidal waveform to excite the plasma and form the plasma sheath, have been unable to desirably form and/or plasma process these smaller device feature sizes.

A typical plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". In a capacitively coupled gas discharge, the plasma is created by using a radio frequency (RF) generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The formed plasma sheath results in rectification of the applied RF field, such that a direct-current (DC) voltage drop, or "self-bias", appears between the substrate and the plasma, making the substrate potential negative with respect to the plasma potential. The generated voltage drop determines the average energy of the plasma ions accelerated towards the substrate, and the provided RF waveform determines the Ion Energy Distribution Function (IEDF) of the plasma ions that are used in the etching process or at least part of a deposition process. In typical plasmas that utilize an RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. Moreover, due to the interaction of the delivered one or more RF frequencies and/or related harmonics with the complex load formed within the process chamber by the plasma, non-uniformity of the plasma and undesirable ion-energy-distribution-functions (IEDFs) are often created by conventional plasma processing systems. The non-uniform plasma and undesirable IEDF will affect the properties of the etching and/or deposition process performed on the substrate, such as the etching profile, etching uniformity, re-sputtering uniformity of the deposited film when the substrate is biased during processing and re-sputtering rate. As feature sizes continue to diminish and the aspect ratio increases, while feature profile control requirements become more stringent, it becomes more desirable to have a well-controlled IEDF at the substrate surface during the plasma process.

As the demand for ever smaller microelectronic features sizes increases, there is a need in the art of plasma processing for further improvements in plasma processing technology. Therefore, there is a need for an apparatus and method of processing a substrate that solves the problems described above.

SUMMARY

Embodiments provided herein generally include apparatus, plasma processing systems and methods for processing a substrate in a plasma processing system. In one example, the plasma processing system includes a physical vapor deposition chamber.

One embodiment of the present disclosure is directed to a method of processing a substrate in a plasma processing chamber. The method generally includes amplifying a broadband signal, splitting the amplified broadband signal across a plurality of channel paths coupled to an impedance matching network, and adjusting at least one first impedance associated with the impedance matching network to achieve a second impedance within a threshold value based at least in part on feedback associated with the broadband signal. The impedance matching network includes a plurality of impedance matching circuits coupled to plasma excitation circuitry, and each of the impedance matching circuits is coupled to a different path of the plurality of channel paths and an output node.

One embodiment of the present disclosure is directed to a plasma processing system. The system generally includes an amplifier configured to amplify a broadband signal, a filter array coupled to the amplifier and configured to split the amplified broadband signal across a plurality of channel paths, an impedance matching network comprising an input side coupled to the channel paths and an output side, wherein the output side of the impedance matching network includes a plurality of impedance matching circuits that are coupled to an output node that is configured to be coupled to an electrode of a plasma processing chamber within the plasma processing system, and each of the impedance matching circuits is coupled to a different path of the plurality of channel paths. The system further includes a memory and a processor coupled to the memory. The processor is configured to adjust at least one first impedance associated with the impedance matching network to achieve a second impedance within a threshold value based at least in part on feedback associated with the broadband signal.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
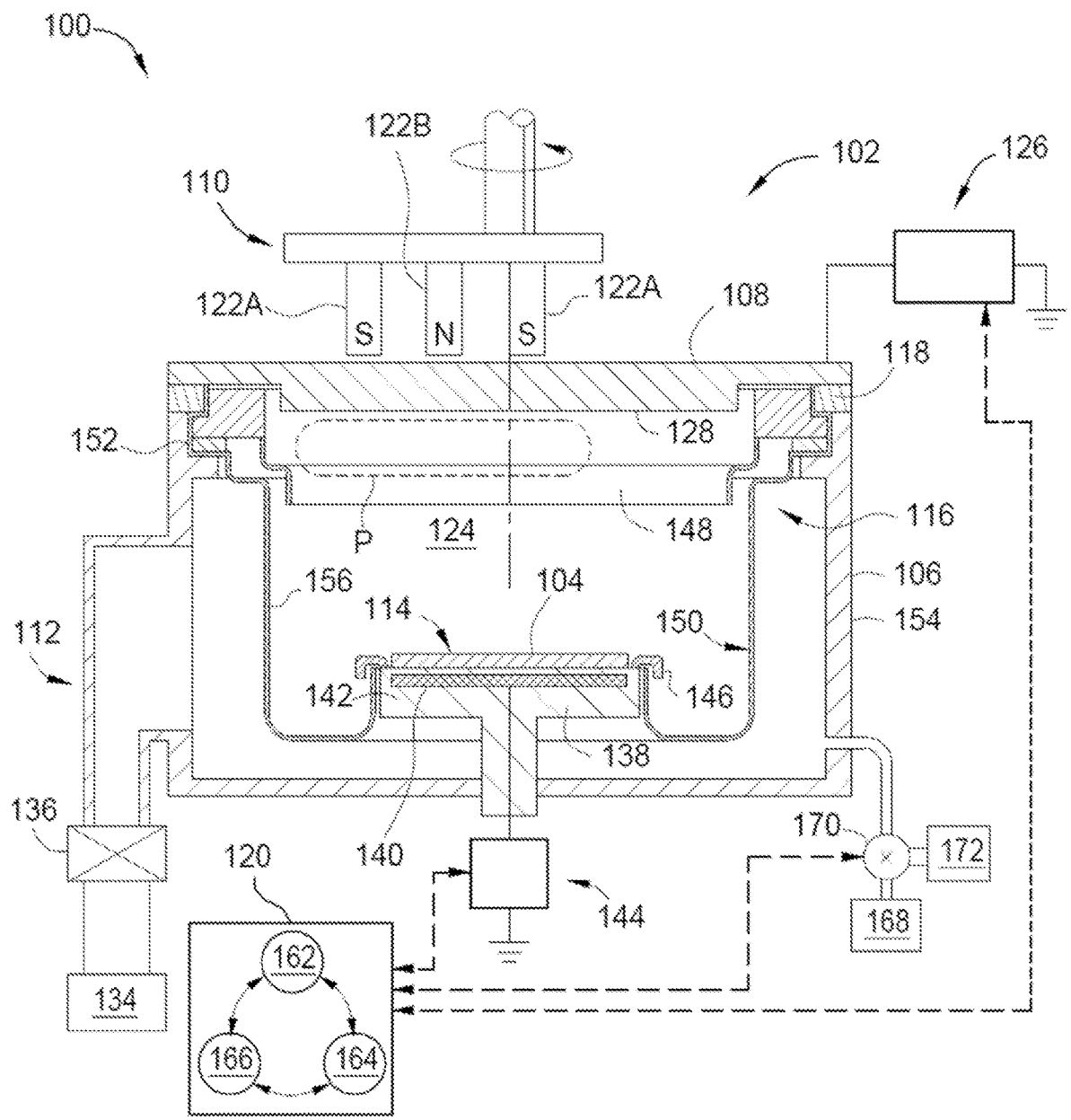
FIG. 1 is a schematic cross-sectional view of a processing system, according to one or more embodiments, configured to practice the methods set forth herein.

With semiconductor manufacturing processes advancing towards higher component densities, fabrication of smaller features with larger aspect ratios involve atomic precision for most plasma processing processes. Embodiments of this disclosure describe a biasing scheme that is configured to provide a radio frequency (RF) generated waveform from a power source to one or more electrodes within a processing chamber to create a desirable ion energy distribution function (IEDF) at the surface of the substrate during one or more plasma processing steps performed within the processing chamber. The plasma process(es) disclosed herein can be used to control the shape of IEDF and thus the interaction of the plasma with a surface of a substrate during processing. In some configurations, the plasma process(es) disclosed herein are used to control the profile of features formed in the surface of the substrate during processing.

Some embodiments of the present disclosure are generally directed to techniques and apparatus for dynamic impedance matching in broadband supply circuitry within a power source for performing a plasma process on a substrate. The broadband supply circuitry may use the concept of voltage waveform tailoring to provide multiple frequency band specific impedance matching circuits for the power source of the plasma processing system. The impedance matching may be applied to multiple frequency bands to provide a specific impedance per frequency band. For example, the broadband circuitry may adjust the impedance associated with each of multiple impedance matching circuits, where each of the impedance matching circuits is used for a different frequency band.

The techniques and apparatus for dynamic impedance matching described herein may provide various advantages for capacitively coupled plasma processes, such as an etching, physical vapor deposition (PVD), plasma enhanced atomic layer deposition (PEALD) or plasma enhanced chemical vapor deposition (PECVD) process. For example, the techniques and apparatus for dynamic impedance matching described herein may allow for separate control of the mean ion energy and flux with phase control of the RF signal applied to one of the electrodes disposed in the plasma processing chamber. In one example, the RF signal is applied to an electrode disposed within a substrate support on which a substrate is placed during processing. The techniques and apparatus for dynamic impedance matching described herein may enable control of the shape of the ion energy distribution function (IEDF), which can in turn allow for etch and/or deposition selectivity, improved feature shaping and improved process uniformity. The techniques and apparatus for dynamic impedance matching described herein may allow control of the electron energy distribution function (EEDF). The techniques and apparatus for dynamic impedance matching may allow for control of plasma uniformity, for example, due to the efficient and accurate power delivery to the excitation circuitry of the plasma processing system.

Plasma Processing System Example

While not intending to be limiting as to the scope of the disclosure provided herein, the apparatus and methods described herein include a dynamic impedance matching system that is connected to and/or disposed within a PVD type of plasma processing chamber. However, the dynamic impedance matching system, and methods of using the same, disclosed herein can also be used in other similarly configured types of plasma processing chambers, such as a dry etching chamber (e.g., RIE chamber), a PECVD processing chamber, a plasma-enhanced atomic layer deposition (PEALD) chamber, a plasma doping (PLAD) chamber or other plasma processing chamber that requires biasing of a substrate during one or more phases of a plasma process performed therein.

FIG. 1 is a schematic cross-sectional view of a plasma processing system 100 configured to perform one or more of the plasma processing methods set forth herein, such as PVD deposition processes. The plasma processing system 100 may include a processing chamber 102. In one embodiment, the processing chamber 102 is adapted to deposit a suitable sputtered film on a surface of a substrate 104. The processing chamber 102 includes a vacuum chamber 106, a target 108, a magnetron 110, vacuum pumping system 112, a substrate support assembly 114, and a process kit 116. The vacuum chamber 106 supports the target 108, which is sealed at one end of the vacuum chamber 106 through a target isolator 118 using a plurality of o-rings. The target 108 has at least a surface portion composed of material to be sputter deposited on the substrate 104 disposed on the substrate support assembly 114. As an example, the target 108 may include any of various sputtering materials, such as a sputtering metal, sputtering alloy, or sputtering compound. In some cases, the sputtering material of the target may include aluminum, copper, tungsten, cobalt, silver, gold, carbon, iron, titanium, or a combination thereof. In some cases, the sputtering material of the target may include other types of materials, such as various metal oxides, metal nitrides or silicon.

The magnetron 110, which is disposed adjacent to and rotated relative to the target 108, includes a plurality of magnets 122A, 122B that are used to confine a plasma "P" generated in a processing region 124 by biasing the target 108 using a first power source 126 to "sputter" material from the target surface 128. The first power source 126 will typically include a direct current (DC) power sources and/or an RF power source that are configured to apply a desired amount of bias of the target 108 to allow the sputtering of the target material and/or sustain the plasma "P" formed in the processing region 124 disposed between the substrate 104 the target 108. It is appreciated that the type of magnetron may vary, depending upon the particular PVD application.

In other non-PVD types of plasma processing systems, the processing chamber 102 can include a different configuration of the upper portion of the processing chamber 102. For example, when the processing chamber 102 is adapted to perform a PECVD process, RIE process or PEALD process, the magnetron 110 and the target 108 illustrated in FIG. 1 will typically be replaced by a plate electrode (not shown) or a showerhead (not shown) that is positioned over the substrate support assembly 114 and configured to distribute one or more process gases (e.g., precursors or etching gases) to the processing region 124 of the processing chamber 102 during processing.

The vacuum pumping system 112 generally comprises a pump assembly 134 and valve 136. The pump assembly 134 may generally comprise a cryopump (not shown) and roughing pump(s) (not shown) that are used to maintain a specific pressure in the processing region 124 of the processing chamber 102.

The substrate support assembly 114 may include a substrate support pedestal 138, which may comprise a pedestal electrode 140 and an electrostatic chuck 142 that has a supporting surface that is adapted to support the substrate 104 over the pedestal electrode 140. It is appreciated that other devices may be used to hold the substrate 104 in place during processing. Resistive heaters (not shown), refrigerant channels (not shown), and a thermal transfer gas cavities (not shown) may be formed in the substrate support pedestal 138 to provide thermal control of the substrate 104 during processing. In some applications, as will be discussed further below, the pedestal electrode 140, which is coupled to a second power source 144 so that a bias can be supplied to the substrate 104 to attract ions that are generated in the plasma "P". The second power source 144 includes broadband supply circuitry to dynamically adjust the impedance matching applied across multiple frequency bands to an electrode (e.g., pedestal electrode 140) within the substrate support 114, as further described herein with respect to FIGS. 4-7.

The process kit 116 may generally include a cover ring 146, darkspace shield 148 and a chamber shield 150 that are separated by a dielectric shield isolator 152. The process kit 116 parts are positioned within the vacuum chamber 106 to protect the chamber wall 154, which usually comprises a metal that is electrically grounded, from the sputtered material generated in the processing region 124. The darkspace shield 148 may be permitted to float electrically and the chamber shield 150 may be electrically grounded. However, in some aspects, either or both shields may be grounded, floating or biased to the same or different non-ground levels. The shields 148, 150 are typically composed of stainless steel, and their respective inner sides 156 may be beadblasted or otherwise roughened to promote adhesion of the material sputter deposited on them. At some point during prolonged sputtering, however, the deposited material builds up to a thickness that is likely to flake off, producing deleterious particles. Before this point is reached, the shields 148, 150 may be cleaned or replaced.

Plasma processes performed in the processing chamber 102 can include one or more steps where: 1) a deposition process is predominantly performed on a substrate, 2) a process where both deposition and partial etching of a deposited film layer are simultaneously occurring, or 3) a process where etching is predominantly occurring on a surface of the substrate or a deposited film layer. The apparatus and processes described herein can be used to adjust the plasma uniformity over the substrate 104 and adjust the sheath formed over the substrate 104 to control the IEDF of the ions that interact with the substrate during one or more steps of a process performed in the processing chamber 102. In some embodiments, a direct current (DC), a pulsed DC, an RF and/or a pulsed RF bias signal can be applied to the pedestal electrode 140 by the second power source 144, while the target 108 is biased by the first power source 126. Such signals have been found to significantly improve the etching, deposition or re-sputtering of a deposited layer or form features in the surface of the substrate during an etching process. In some embodiments, to attract the ions generated by the plasma to substrate 104, the electrode 140 may be biased by the second power source 144 to provide an average power of 1 to 5 kW, for example. The DC and/or RF bias signals applied to the electrode 140 may include a signal that has a plurality of alternating first and second intervals, wherein in each of the first intervals, the voltage of the applied bias signal is negative to attract ions to the substrate, and during the alternating second intervals, the applied bias signal is positive in order to dissipate the charge buildup accumulated during the first interval. In some configurations, during the deposition process, the pedestal electrode 140 is be negatively biased by the second power source 144 at a negative voltage of between zero and −1000 Volts, such as about −300 VDC for example, to negatively bias the substrate 104 to attract the ionized deposition material to the substrate 104.

The processing system 100 may also include a system controller 120. The system controller 120, also referred to herein as a processing chamber controller, includes a processor 162, a memory 164, and circuitry 166. The system controller 120 is used to control the process sequence used to process the substrate 104, including performing certain aspects of spectral impedance matching as further described herein. The processor 162 may include a general-purpose computer processor configured for use in an industrial setting for controlling the processing chamber and sub-processors related thereto. The processor 162 may include a digital signal processor (DSP), an ASIC, a field programmable gate array (FPGA) or other programmable logic device (PLD), discrete gate or transistor logic, discrete hardware components, or any combination thereof designed to perform the functions described herein. The processor 162 is coupled to the memory 164. The memory 164 described herein, which is generally non-volatile memory, may include random access memory, read-only memory, floppy or hard disk drive, or other suitable forms of digital storage, local or remote. The circuitry 166 is conventionally coupled to the processor 162 and comprises cache, clock circuits, input/output subsystems, power supplies, and the like, and combinations thereof. Software instructions (e.g., executable instructions) and data can be coded and stored within the memory 164 for instructing the processor 162. A software program (or computer instructions) readable by the processor 162 in the system controller 120 determines which tasks are performable by the components in the processing system 100.

Typically, the program, which is readable by the processor 162 in the system controller 120, includes code, which, when executed by the processor 162, performs the methods relating to the plasma processing schemes described herein. The code may include executable instructions that are used to control the various hardware and electrical components within the processing system 100 to perform the various process tasks and various process sequences used to implement the methods described herein. In certain aspects, the code includes executable instructions that are used to perform one or more of the operations described herein in connection with FIG. 7. In certain aspects, the system controller 120 may be in communication with the first power source 126 and/or the second power source 144 to control the output signal(s) generated by the first power source 126 and/or the second power source 144.

A first gas source 168 supplies a processing gas or sputtering working gas, for example, a chemically inactive noble gas, such as argon (Ar), to the vacuum chamber 106 through a mass flow controller 170. In certain aspects, the system controller 120 may be in communication with the mass flow controller 170 to control the flow of the working gas supplied to the processing chamber 102. The working gas can be admitted to the top of the vacuum chamber or, as illustrated, at its bottom, either with one or more inlet pipes penetrating apertures through the bottom of the chamber shield 150 or through a gap between the chamber shield 150, the electrostatic chuck 142, and the substrate support pedestal 138. In certain aspects, during reactive PVD processes the processing gas may also include a nitrogen containing gas that is delivered from a second gas source 172 to form a nitride containing layer, such as aluminum nitride, on the substrates 104. In plasma processing configurations in which etching is to occur a reactive etching gas may be supplied to the processing region 124 of the processing chamber 102 by the first gas source 168.

Broadband Supply Circuitry

Certain embodiments of the present disclosure are generally directed to techniques and apparatus for dynamic impedance matching across multiple frequency bands of a power source for use in a plasma processing system, such as a PVD processing system. In some embodiments, the broadband supply circuitry described below, which is disposed within the second power source 144, is configured to dynamically adjust a bias applied to a substrate 104 disposed on the substrate support pedestal 138. The applied bias includes multiple frequency bands that are dynamically impedance matched.

Voltage waveform tailoring (VWT) is a technique for generating a customized voltages waveform based on a Fourier series of harmonics of a fundamental frequency. The driving voltage waveform can be realized as a Fourier series of N consecutive harmonics of a fundamental frequency, f, according to the following expression:

$$\phi(t) = \sum_{k=1}^{N} \phi_k \cos(2\pi k f t + \theta_k)$$

where N is the number of consecutive harmonics of the fundamental frequency f; $\phi_k$ is the amplitude of a given harmonic; and $\theta_k$ is the phase angle of a given harmonic. The total amplitude ($\phi_{tot}$) of the waveform may be determined as follows:

$$\phi_{tot} = \sum_{k=1}^{N} \phi_k$$

The customized voltage waveform signals formed via VWT may be applied to the excitation circuitry of a PVD processing system, such as the electrode 140 disposed within the substrate support pedestal 138. The customized voltage waveform signals may be formed by adjusting the phase and/or amplitude of the harmonics to control the sheath and ion flux energy in the processing chamber.

Figure 2A:
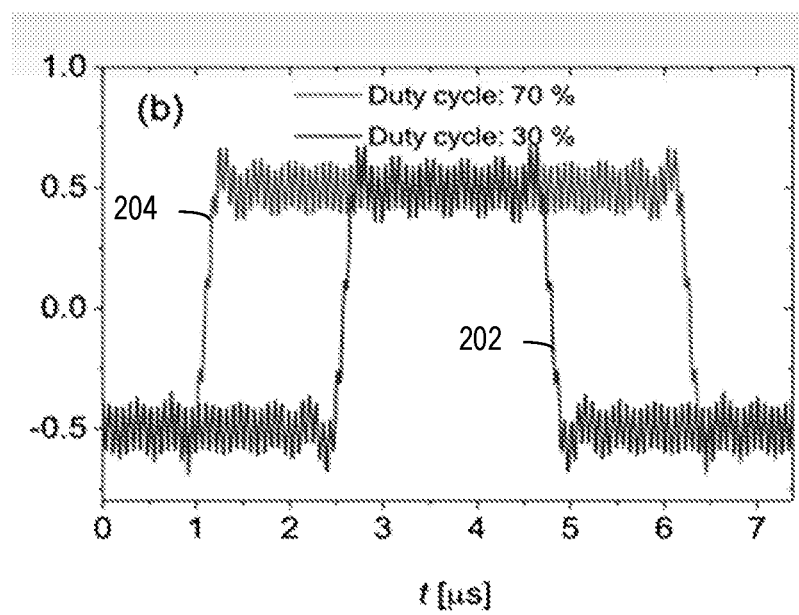
FIG. 2A shows example voltage waveforms over time, according to one or more embodiments.

FIG. 2A illustrates example voltage waveform signals as a function of time that can be applied to the plasma (e.g., complex load) by a power source that is coupled to one or more of the electrodes (e.g., electrode 140) disposed within the plasma processing chamber. In this example, a first voltage waveform 202 may have a duty cycle of thirty percent, and a second voltage waveform 204 may have a duty cycle of seventy percent. The voltage waveforms 202, 204 are examples of waveforms that can used in voltage waveform tailoring.

Figure 2B:
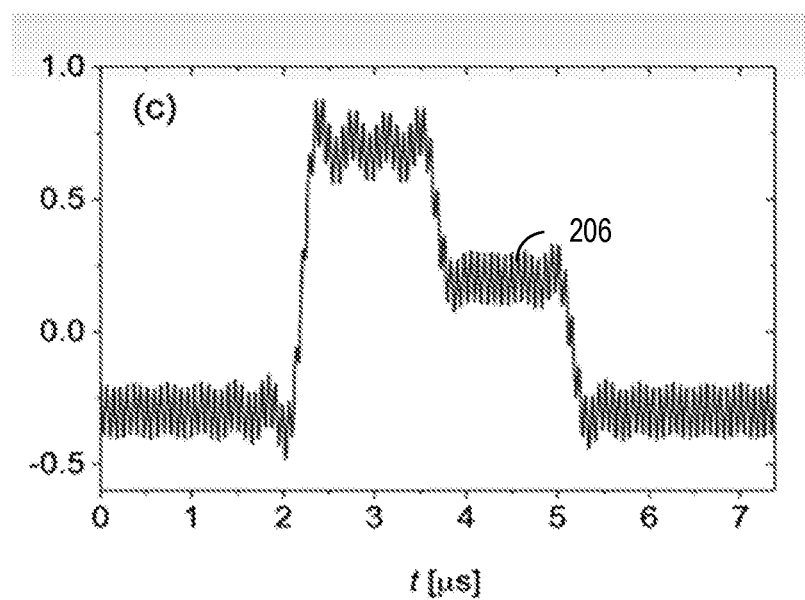
FIG. 2B shows an example voltage waveform resulting from a combination of the voltage waveforms depicted in FIG. 2A.

FIG. 2B illustrates an example voltage waveform 206 resulting from a combination of the voltage waveforms 202, 204 depicted in FIG. 2A. In this example, the phase and amplitude of the voltage waveforms 202, 204 may be adjusted, such that the sum of the voltage waveforms 202, 204 may result in the voltage waveform 206 with the application of voltage waveform tailoring.

Figure 3:
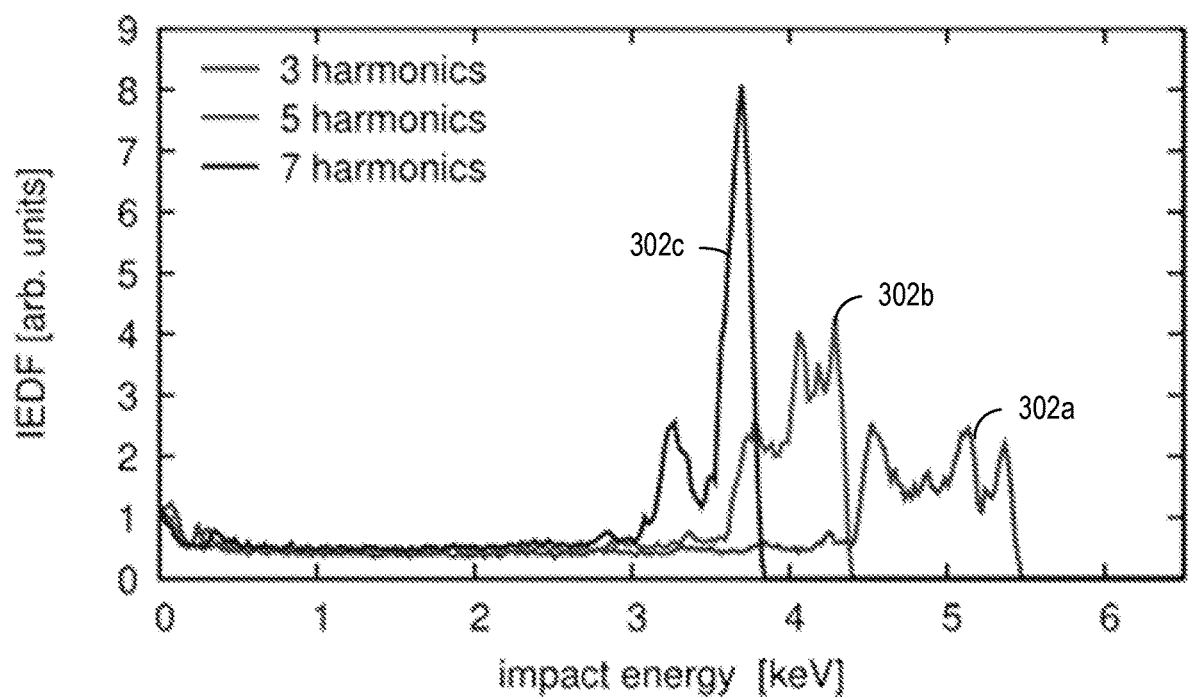
FIG. 3 illustrates example ion energy distribution functions (IEDFs) associated with excitation waveforms generated with three, five, and seven harmonics, respectively.

FIG. 3 illustrates example ion energy distribution functions (IEDFs) 302a-c associated with excitation waveforms generated with three, five, and seven harmonics, respectively. In this example, the three harmonic waveform provides an IEDF 302a with the lowest peak at higher impact energies. The five harmonic waveform provides an IEDF 302b with a peak at an impact energy between the three and seven harmonic waveforms. The seven harmonic waveform may provide an IEDF 302c with the highest peak at the lowest impact energy. It will be appreciated that VWT may be used to customize the IEDF of a plasma processing system, such as a PVD system. In some aspects, the three harmonic waveform may be used due to the reduced complexity and cost of fabricating circuitry that supports more harmonics.

Certain aspects of VWT may be extended to controlling the impedance matching of power source circuitry, such as the second power source 144, of a plasma processing system. For example, the power source circuitry may include impedance matching circuits for certain harmonics that could be used to form (or make up) the excitation signal.

Figure 4:
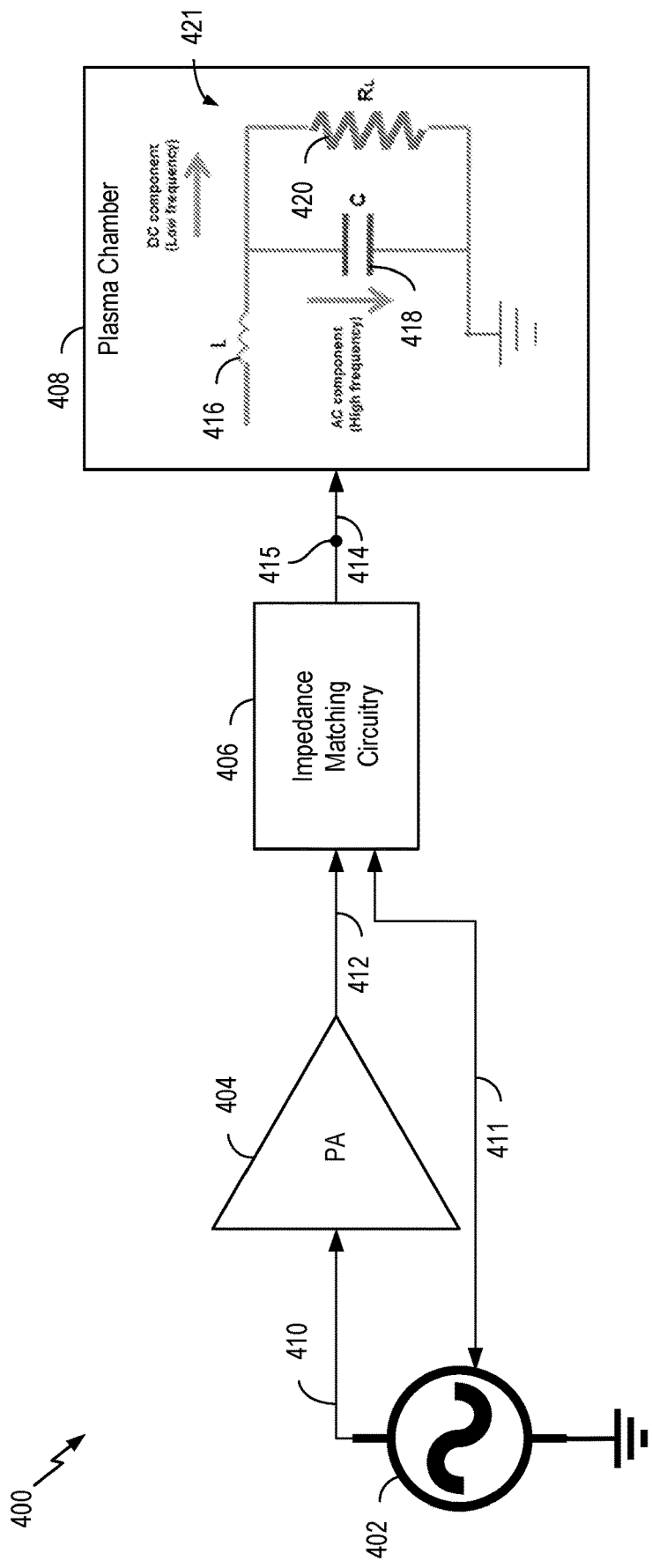
FIG. 4 is a diagram illustrating an example broadband supply circuit.

FIG. 4 is a diagram illustrating an example broadband supply circuit 400. The broadband supply circuit 400 may be an example of any of the power sources described herein with respect to FIG. 1, such as the second power source 144. In this example, the broadband supply circuit 400 may include a signal generator 402, a power amplifier 404, and impedance matching circuitry 406. The broadband supply circuit 400 may be coupled to an electrode (e.g., electrode 140) disposed within the processing chamber 408 (e.g., the processing chamber 102).

The signal generator 402 may include a device that creates an electronic signal, which may have a specific waveform (e.g., sinusoidal, square wave, saw tooth, etc.). In some cases, the signal generator 402 may output a broadband signal having a wide band of frequencies, such as a broadband having multiple harmonics or frequency channels. For example, the broadband signal may include a fundamental frequency of 13.56 MHz, a second harmonic frequency of 27.12 MHz, and third harmonic frequency of 40.68 MHz (or any combination of channels and/or harmonics). The signal generator 402 may include a waveform generator, a radio frequency (RF) signal generator, and/or a DC voltage supply. The waveform generator may produce a pulsed waveform signal in which a RF signal overlaid via the RF signal generator, and the DC voltage supply may output a DC bias voltage for the pulsed waveform signal. In some embodiments, the signal generator 402 at least includes an RF signal generator that is configured to adjust the amplitude, frequency, and wave shape of the output signal. The signal generator 402 may be coupled to the power amplifier 404 and the impedance matching circuitry 406 via a first signal path 410. The signal generator 402 may output the signal to an input of the power amplifier 404 and an input of the impedance matching circuitry 406 via the first signal path 410.

The power amplifier 404 may include a high-power broadband power amplifier. For example, the power amplifier 404 may be configured to amplify a signal to a power of 3 kilowatts (kW) or more across a spectrum of 1 to 100 megahertz (MHz). The power amplifier 404 may be coupled between the signal generator 402 and the impedance matching circuitry 406. The power amplifier 404 may obtain the signal output from the signal generator 402 via the first signal path 410 and output an amplified signal to the impedance matching circuitry 406 via a second signal path 412. In some configurations, a synchronization signal is provided from signal generator 402 to the impedance matching circuitry 406 via a communication signal path 411 and/or provided to the system controller 120 via a similar communication signal path (e.g., path 411 in FIG. 5).

Figure 5:
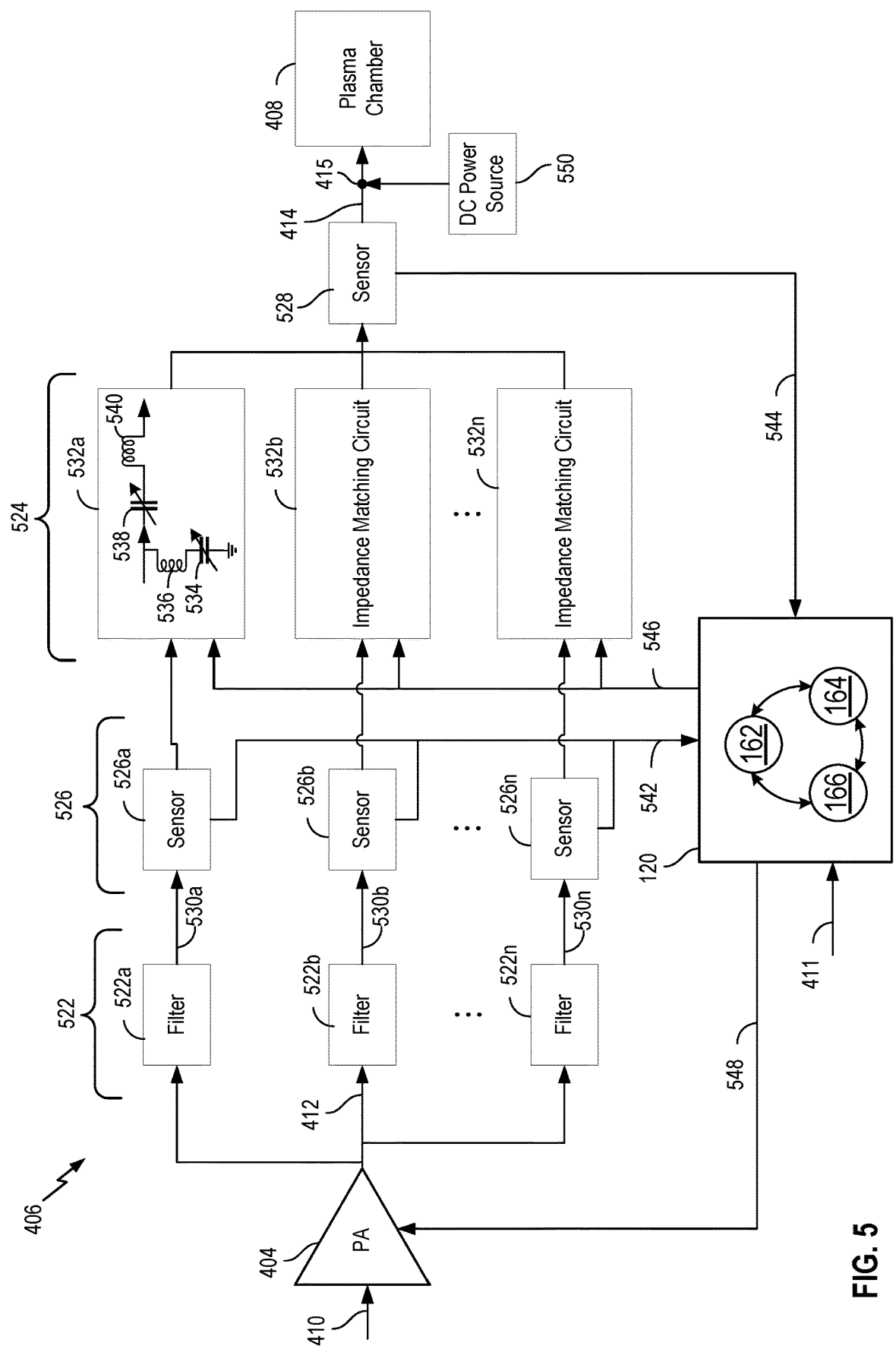
FIG. 5 is a diagram illustrating further aspects related to the impedance matching circuitry of the example broadband supply circuit depicted in FIG. 4.

The impedance matching circuitry 406 may include circuitry that splits the amplified signal received from path 412 across multiple frequency channels (e.g., harmonic channels) and an impedance matching network as further described herein with respect to FIG. 5. The impedance matching circuitry 406 may also obtain the signal output from the signal generator 402 and use the signal in determining how to adjust the impedance matching applied to the impedance matching network. The impedance matching circuitry 406 is coupled between the power amplifier 404 and the processing chamber 408. The impedance matching circuitry 406 may output the excitation signal applied to an electrode (e.g., electrode 140) within the processing chamber via an output node 415 disposed along a third signal path 414.

The processing chamber 408 can include a plasma processing chamber, such as the processing chamber 102 depicted in FIG. 1. In certain aspects, the capacitively coupled plasma (CCP) in the processing chamber 408 may be modeled as a complex load 421 having an inductance 416, capacitance 418, and resistance 420, where the inductance 416 is coupled in series with a capacitive load including the capacitance 418 coupled in parallel with the resistance 420. The capacitance 418 may be representative of the high frequency (RF) reactance component of a complex impedance, and resistance 420 may be representative of the low frequency (e.g., DC) resistance component of the complex impedance. As an example, the inductance 416 may be 100 nano henrys (nH), the capacitance 418 may be 400 pico farads (pF), and the resistance 420 may be 300 ohms.

FIG. 5 is a diagram illustrating further aspects related to the impedance matching circuitry 406 of the example broadband supply circuit 400 depicted in FIG. 4. In this example, the impedance matching circuitry 406 may include a filter array 522, an impedance matching network 524, first sensors 526, and a second sensor 528. The impedance matching circuitry 406 may also include a processor and a memory, such as the processor 162 and the memory 164 included in the system controller 120.

The filter array 522 may be a filter bank having a plurality of filters 522a-n coupled in parallel with each other. The filter array 522 may serve as a channelizer, where the filter array 522 includes a set of parallel bandpass filters (or a combination of a low-pass filter, bandpass filter(s), and a high-pass filter) that split an input broadband signal into a set of narrow subbands or channels. As an example, any of the filters 522a-n may include an inductor-capacitor (LC) filter. The filter array 522 is coupled to the amplifier via the second signal path 412. The filter array 522 is configured to split the amplified signal output from the power amplifier 404 across a plurality of channel paths 530a-n, where each of the channel paths 530a-n may correspond to a different frequency channel or subband. Each of the filters 522a-n may be configured to allow a specific frequency channel (subband) of the amplified signal to pass and attenuate other frequencies. Each of the filters 522a-n may be configured as a bandpass (notch) filter having a different center frequency. In some cases, the center frequencies and/or passband of the filters 522a-n may include harmonics of a particular fundamental frequency, such that the subbands or channels associated with the channel paths 530a-n may include the respective harmonics.

The broadband signal may be split into any number of harmonics or frequency channels, such as two harmonics or channels, three harmonics or channels, five harmonics or channels, or seven harmonics or channels, for example, as described herein with respect to FIG. 3. For example, the filters 522a-n may include three filters where the first filter has a center frequency of 13.56 MHz, the second filter has a center frequency of 27.12 MHz, and the third filter has a center frequency of 40.68 MHz. In some cases, the broadband signal may be split into any combination of harmonics or frequency channels. For example, the broadband signal may be split into a fundamental frequency (e.g., 13.56 MHz)

and a second harmonic (e.g., 27 MHz), split into a fundamental frequency (e.g., 13.56 MHz) and a third harmonic (e.g., 40 MHz), or split into a fundamental frequency (e.g., 13.56 MHz) and an upper channel (e.g., 60 MHz). In certain cases, the filter associated with the lowest channel (e.g., filter 522a) may be configured as a low-pass filter, and the filter associated with the highest channel (e.g., filter 522n) may be configured as a high-pass filter. In some cases, the filter associated with the lowest channel (e.g., filter 522a) may be configured as a combination of a low-pass filter and a bandpass filter.

In certain aspects, different gains and/or phase shifts applied via the filter array 522 to harmonics of the broadband signal output from the power amplifier 404 may allow the application of VWT to form a customized waveform as described herein with respect to FIGS. 2A, 2B, and 3. Each of the filters 522a-n may be configured to apply a certain gain and/or a certain phase shift to a harmonic or channel associated with the broadband signal output from the power amplifier 404. For example, the filters 522a-n may include three filters, where the first filter may have a first gain and/or a first phase shift (e.g., a phase shift of 0 degrees) applied to a first harmonic (e.g., 13.56 MHz), the second filter may have a second gain and/or second phase shift (e.g., a phase shift of 90 degrees) applied to a second harmonic (e.g., 27.12 MHz), and the third filter may have a third gain and/or a third phase shift (e.g., a phase shift of 165 degrees) applied to a third harmonic (e.g., 40.68 MHz).

In certain aspects, different or separate phase shifts may be applied to different harmonics or channels via the filters 522a-n. The separate phase shifts applied at the filters 522a-n may allow the impedance matching circuitry 406 to control the ion energy distribution associated with the excitation waveform applied to an electrode, e.g., the electrode 140. For example, the impedance matching circuitry 406 may apply a first set of phases at the filters 522a-n for a deposition operation and a second set of phases at the filters 522a-n for an etching operation. In some cases, the impedance matching circuitry 406 may include multiple sets of the filters 522a-n that have different or separate filter characteristics, such as center frequencies or pass bands, gains, and/or phase shifts. The system controller 120 may select the particular set of filters 522a-n to use to form the excitation waveform, for example, via a multiplexer or switches (not shown) coupled between the PA 404 and the filters 522a-n.

For certain aspects, the phase shift(s) may be applied in stages, where the PA 404 may apply first phase shift(s) (e.g., a fine phase shift), and the filters 522a-n may apply second phase shifts (e.g., coarse phase shifts). The system controller 120 may control the phase shift(s) applied at the PA 404, for example, via a phase control signal 548. The phase control signal 548 may indicate the phase shift(s) to apply at the PA 404.

The impedance matching network 524 may include a plurality of impedance matching circuits 532a-n, where each of the impedance matching circuits 532a-n is coupled to a different path (e.g., a different harmonic subband) of the plurality of channel paths 530a-n. The impedance matching network 524 may include an input side coupled to the channel paths 530a-n and an output side. The output side of the impedance matching network 524 may include the impedance matching circuits 532a-n that are coupled to an output node 415 (e.g., corresponding to the third signal path 414). In some cases, a DC offset may be applied to the output node 415 to provide a DC bias to the excitation waveform. For example, a DC power source 550 may be coupled to the output node 415, and the DC power source 550 may output a DC offset signal. The output node of the broadband supply circuit may be configured to be coupled to excitation circuitry of the plasma chamber 408, such as the target 108 and/or electrode 140.

As shown, the impedance matching circuit 532a may include various circuitry with a complex output impedance that can be matched to an input impedance of the plasma excitation circuitry associated with the plasma chamber 408. Any of the other impedance matching circuits 532b-n may have similar circuitry or the same circuitry as described herein with respect to the impedance matching circuit 532a. The impedance matching circuit 532a may include a first capacitor 534, a first inductor 536, a second capacitor 538, and a second inductor 540, where the first capacitor 534 and the first inductor 536 may be coupled in series to a branch coupled to an input node, and the second capacitor 538 and the second inductor 540 may be coupled in series between the input node and output node. In certain cases, the various circuitry of the impedance matching circuit 532a may have one or more variable or adjustable properties, such as resistance, inductance, capacitance, reactance, and/or impedance. For example, the capacitors 534, 538 may include variable capacitors, such as a (high voltage) vacuum variable capacitor, varactor, or varicap. The system controller 120 may adjust the impedance of the impedance matching circuit 532a, for example, via the variable capacitors, to match the input impedance of the plasma excitation circuitry, as further described herein. Each of the impedance matching circuits 532a-n may be dynamically configured (e.g., adjusted) to match the input impedance of the plasma excitation circuitry in response to feedback. Each of the impedance matching circuits 532a-n may be configured and/or adjusted to have a different complex impedance to facilitate efficient power delivery to the plasma chamber 408 across the harmonics of the broadband signal.

The processor 162 may be configured to adjust at least one first impedance associated with the impedance matching network 524 to satisfy a threshold associated with a second impedance of the plasma excitation circuitry based at least in part on feedback associated with the signal. The first impedance may include the output impedances associated with each of the impedance matching circuits 532a-n. The second impedance may include the input impedance of the plasma excitation circuitry, e.g., the impedance of the complex load 421. The threshold may correspond to a difference of the first impedance and the second impedance, for example, plus or minus (±) a certain percent difference (±5%). The first impedance may satisfy the threshold if the difference of the first impedance and the second impedance is within a certain percent difference (e.g., ±5% or 10%) of the second impedance.

The feedback associated with the signal may include measurements obtained from the first sensors 526 and/or the second sensor 528 via a first feedback path 542 and a second feedback path 544, respectively. Each of the first sensors 526 may be coupled to a different path of the channel paths 530a-n to allow for separate measurements of the harmonics. The second sensor may be coupled to the third signal path 414 to measure the output of the impedance matching network 524. The feedback may also include the synchronization signal from the signal generator 402 obtained via the first the communication signal path 411. The synchronization signal may indicate when a change in the waveform occurs, such as a pulse, RF waveform, a rise, or a fall. The measurements from the first sensors 526 and/or the second sensor 528 may include one or more properties associated with the subbands of the signal and/or the broadband signal.

For example, the measurements may include any of a voltage, a current, a phase, an amplitude, and/or a power.

The feedback may allow the processor 162 to evaluate the performance of the impedance matching network 524, and the processor 162 may adjust the output impedance of each of the impedance matching circuits 532a-n to provide a specific output impedance per frequency band. The feedback may indicate that the broadband supply circuit is receiving electrical reflections from the plasma chamber 408. For example, an increase in power exhibited on the third signal path 414 may be indicative of electrical reflections, and thereby, an impedance mismatch. In response to the feedback, the processor 162 may adjust the output impedance of a particular impedance matching circuit 532a-n. For example, the processor 162 may output a control signal via a control path 546 coupled to each of the impedance matching circuits 532a-n. In certain aspects, the control path 546 may include a separate control path for each of the impedance matching circuits 532a-n. The control signal may indicate an impedance adjustment for a particular impedance matching circuit 532a-n. As an example, suppose the variable capacitors 534, 538 are voltage controlled, the control signal may be a voltage signal coupled to the variable capacitors of the impedance matching circuit such that capacitance of the capacitors 534, 538 depends on the voltage level of the control signal.

Figure 6A:
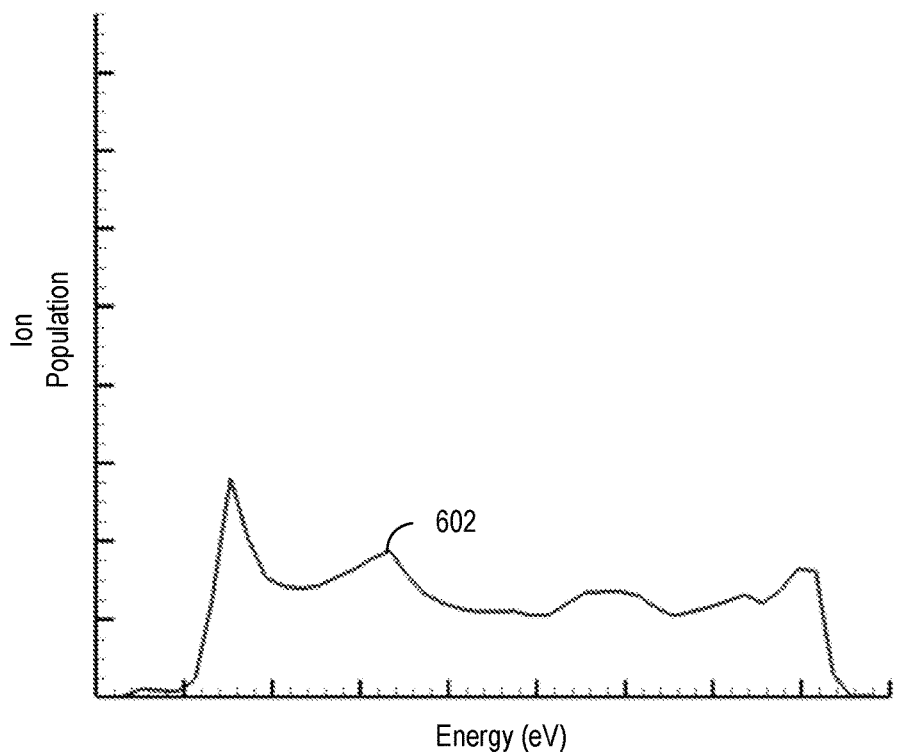
FIGS. 6A and 6B illustrate example ion populations across an energy spectrum for different excitation waveforms including channels with different phase offsets.
Figure 6B:
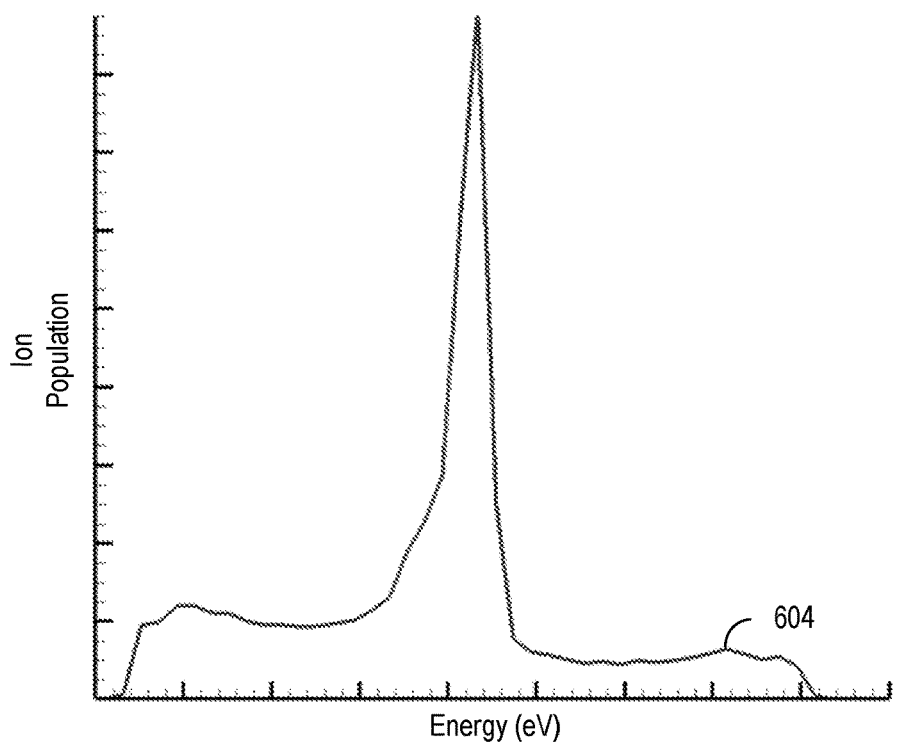

FIGS. 6A and 6B illustrate example ion populations across an energy spectrum for different excitation waveforms including channels with different phase offsets. Referring to FIG. 6A, the curve 602 is associated with an excitation waveform formed from two signals having the same phase (e.g., 0 degrees) in different channels (e.g., 13.56 MHz and 60 MHz). In this example, the ion population is within a narrow range of values across the energy spectrum allowing for a relatively even ion distribution across the energy spectrum.

Referring to FIG. 6B, the curve 604 is associated with an excitation waveform formed from two signals having a phase offset of 165 degrees in different channels (e.g., 13.56 MHz and 60 MHz). For example, the first signal may have a phase of 0 degrees, and the second signal may have a phase of 165 degrees. In this example, the ion population has a peak value at a certain energy level allowing for a concentration of ions at such an energy level. FIGS. 6A and 6B demonstrate that the phase control may allow the impedance matching circuitry described herein to control the ion energy distribution produced by the excitation waveform. In certain aspects, the phase control described herein may allow the impedance matching circuitry to select the ion energy distribution produced by the excitation waveform, for example, based on the particular plasma processing operation (such as a deposition operation or an etching operation).

Figure 7:
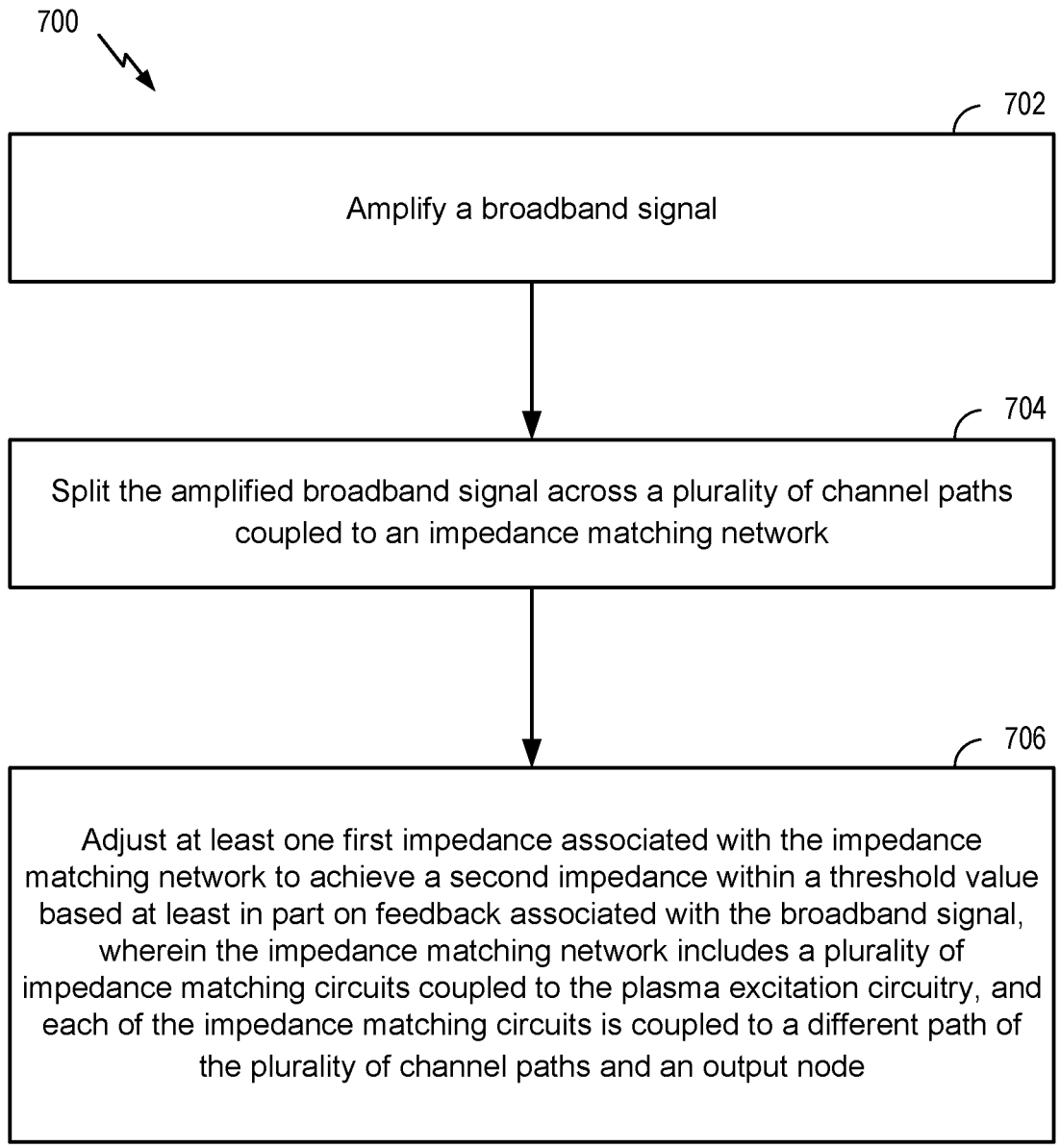
FIG. 7 is a process flow diagram illustrating an example method of processing a substrate in a plasma processing chamber.

FIG. 7 is a process flow diagram illustrating an example method 700 of processing a substrate in a physical vapor deposition chamber. The method 700 may be performed by a processing system, such as the processing system 100, with a broadband supply circuit, such as the broadband supply circuit 400.

The method 700 may optionally begin at activity 702, where the processing system may amplify a broadband signal, for example, with an amplifier, such as the power amplifier 404.

At activity 704, the processing system may split the amplified broadband signal across a plurality of channel paths coupled to an impedance matching network (e.g., the impedance matching network 524), wherein each of the channel paths are coupled to a separate impedance matching circuit of the impedance matching network. As an example, the amplified signal may be split into certain harmonic channels (or subbands) using a filter array (e.g., the filter array 522). The processing system may split the amplified signal through the filter array configured as a channelizer. The filter array may include a plurality of bandpass filters arranged in parallel. In some cases, the filter array may include a lowpass filter, a bandpass filter, and a highpass filter arranged in parallel. As described herein, the amplified signal may be split into channels associated with harmonics of a fundamental frequency, such as the harmonics including 13.56 MHz, 27.12 MHz, and 40.68 MHz.

At activity 706, the processing system may adjust at least one first impedance (e.g., an output impedance) associated with the impedance matching network to achieve a second impedance (e.g., an input impedance equivalent to the complex load 419) within a threshold value based at least in part on feedback associated with the broadband signal. In certain cases, the first impedance may be adjusted to match the second impedance within the threshold value (e.g., ±5% or 10%). The impedance matching network includes a plurality of impedance matching circuits (e.g., the impedance matching circuits 532a-n) coupled to plasma excitation circuitry, and each of the impedance matching circuits is coupled to a different path of the plurality of channel paths and an output node (e.g., the output node 415).

In certain aspects, the filter array may apply certain gains and/or certain phase shifts to the broadband signal. The filter array may apply a phase shift to at least one of the channel paths, for example, as described herein with respect to FIG. 6B. The channel paths may have the same or different phase offsets as applied by the filter array. The filter array may apply a particular gain (e.g., a power gain, voltage gain, and/or current gain) to at least one of the channel paths.

In certain aspects, the processing system may adjust the first impedance in response to the feedback, for example, when the feedback indicates reflections from the plasma chamber, overvoltage, and/or overcurrents at the output of the impedance matching network due to an impedance mismatch. The feedback may include one or more first measurements across the plurality of channel paths (for example, via the first sensors 526a-n) and/or one or more second measurements associated with an output of the impedance matching network (for example, via the second sensor 528). The measurements may include any of a voltage, a current, a phase, an amplitude, and/or a power associated with the respective signal. The feedback may further include a synchronization signal of a signal generator, for example, via the communication signal path 411.

The processing system may obtain the feedback via at least a plurality of first electrical sensors (e.g., the first sensors 526a-n) and/or a second electrical sensor (e.g., the second sensor 528). Each of the plurality of first electrical sensors may be coupled in series between a different one of the channel paths (e.g., channel paths 530a-n) and a different one of the impedance matching circuits (e.g., the impedance matching circuits 532a-n). The second electrical sensor may be coupled to an output of the impedance matching network.

For certain aspects, to adjust the first impedance, the processing system may tune (adjust) a passive electrical component (e.g., a capacitor, resistor, and/or inductor) associated with at least one of the impedance matching circuits. The passive electrical component may include a variable capacitor, a variable resistor, a variable inductor, or a combination thereof.

In certain aspects, the adjustment at activity 706 may be performed for each of the impedance matching circuits associated with the channel paths and/or a specific impedance matching circuit associated with a particular channel path. The processing system may adjust a third impedance associated with at least one of the impedance matching circuits to satisfy the threshold value associated with the second impedance corresponding to at least one of the channel paths. For example, the third impedance may be the output impedance of the impedance matching circuit 532a to achieve a certain impedance, for example, 50 Ohm impedance at the complex load of the plasma excitation circuitry.

The impedance matching network may be configured to couple to a single component of the plasma excitation circuitry. For example, the processing system may couple the output of the impedance matching network to a single electrode (e.g., the electrode 140) of the plasma excitation circuitry. In some other cases, the processing system may additionally couple the output of the impedance matching network to an electrode disposed adjacent to or within a substrate support disposed within the plasma processing chamber (e.g., PVD chamber). In some embodiments, the plasma processing system may include a plurality of broadband supply circuits 400 (not shown) that each have an output that is coupled to an electrode disposed within the processing chamber.

The techniques and apparatus for dynamic impedance matching described herein may provide various advantages for capacitively coupled plasma processes, such as CCP etching chambers and PVD chambers. It will be appreciated that the techniques and apparatus described herein may allow for efficient and accurate power delivery to an electrode disposed within the plasma processing system, for example, via the harmonic specific impedance matching. The techniques and apparatus described herein may prevent excessive heat, an overcurrent, and/or an overvoltage to occur at the RF supply circuitry.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate in a plasma processing chamber, comprising:
    amplifying a broadband signal;
    splitting the amplified broadband signal across a plurality of channel paths coupled to an impedance matching network; and
    adjusting at least one first impedance associated with the impedance matching network to achieve a second impedance within a threshold value based at least in part on feedback associated with the broadband signal, wherein:
        the impedance matching network includes a plurality of impedance matching circuits coupled to plasma excitation circuitry, and
        each of the impedance matching circuits is coupled to a different path of the plurality of channel paths and an output node.

2. The method of claim 1, wherein the feedback comprises one or more first measurements across the plurality of channel paths and one or more second measurements associated with an output of the impedance matching network.

3. The method of claim 2, wherein the feedback further comprises one or more third measurements of the broadband signal.

4. The method of claim 1, wherein splitting the amplified broadband signal comprises splitting the amplified broadband signal through a filter array.

5. The method of claim 4, wherein splitting the amplified broadband signal comprises applying a phase shift to at least one of the channel paths via the filter array.

6. The method of claim 4, wherein splitting the amplified broadband signal comprises applying a gain to at least one of the channel paths via the filter array.

7. The method of claim 1, wherein adjusting the at least one first impedance associated with the impedance matching network comprises tuning a passive electrical component associated with at least one of the impedance matching circuits.

8. The method of claim 7, wherein the passive electrical component comprises a variable capacitor, a variable resistor, a variable inductor, or a combination thereof.

9. The method of claim 1, further comprising obtaining the feedback via at least a plurality of first electrical sensors and a second electrical sensor, wherein each of the plurality of first electrical sensors is coupled in series between a different one of the channel paths and a different one of the impedance matching circuits, and the second electrical sensor is coupled to an output of the impedance matching network.

10. The method of claim 1, wherein adjusting the at least one first impedance associated with the impedance matching network comprises adjusting a third impedance associated with at least one of the impedance matching circuits to satisfy the threshold associated with the second impedance corresponding to at least one of the channel paths.

11. The method of claim 1, further comprising coupling an output of the impedance matching network to a single electrode of the plasma excitation circuitry.

12. The method of claim 1, wherein the plasma processing chamber comprises a physical vapor deposition chamber, and the method further comprises coupling an output of the impedance matching network to an electrode disposed adjacent to a substrate supporting surface of a substrate support within the physical vapor deposition chamber.

13. A plasma processing system, comprising:
    an amplifier configured to amplify a broadband signal;
    a filter array coupled to the amplifier and configured to split the amplified broadband signal across a plurality of channel paths;
    an impedance matching network comprising an input side coupled to the channel paths and an output side, wherein the output side of the impedance matching network includes a plurality of impedance matching circuits that are coupled to an output node that is configured to be coupled to plasma excitation circuitry of the plasma processing system, and each of the impedance matching circuits is coupled to a different path of the plurality of channel paths and the output node.

14. The system of claim 13, further comprising:
    a memory; and
    a processor coupled to the memory, the processor being configured to adjust at least one first impedance associated with the impedance matching network to achieve a second impedance within a threshold value based at least in part on feedback associated with the broadband signal.

15. The system of claim 13, wherein the filter array is configured to apply a phase shift to at least one of the channel paths.

16. The system of claim 13, wherein the filter array is configured to apply a gain to at least one of the channel paths.

17. The system of claim 14, wherein to adjust the at least one first impedance associated with the impedance matching network, the processor is configured to tune a passive electrical component associated with at least one of the impedance matching circuits.

18. The system of claim 17, wherein the passive electrical component comprises a variable capacitor, a variable resistor, a variable inductor, or a combination thereof.

19. The system of claim 14, wherein:
the processor is further configured to obtain the feedback via at least a plurality of first electrical sensors and a second electrical sensor,
each of the plurality of first electrical sensors is coupled in series between a different one of the channel paths and a different one of the impedance matching circuits, and
the second electrical sensor is coupled to an output of the impedance matching network.

20. The system of claim 13, wherein the plasma processing system comprises a plasma processing chamber, and an output of the impedance matching network is coupled to an electrode disposed adjacent to a substrate supporting surface of a substrate support disposed within the plasma processing chamber.

* * * * *